United States Patent [19]

El-Ghoroury et al.

[11] Patent Number: 6,002,352
[45] Date of Patent: Dec. 14, 1999

[54] METHOD OF SAMPLING, DOWNCONVERTING, AND DIGITIZING A BANDPASS SIGNAL USING A DIGITAL PREDICTIVE CODER

[75] Inventors: Hussein S. El-Ghoroury, Carlsbad; Steven D. Hall; Matthew Millward, both of Encinitas, all of Calif.

[73] Assignee: International Business Machines Corporation, Armonk, N.Y.

[21] Appl. No.: 08/881,690

[22] Filed: Jun. 24, 1997

[51] Int. Cl.$^6$ .................................................... H03M 1/18
[52] U.S. Cl. ............................................................. 341/139
[58] Field of Search ..................................... 341/139, 144, 341/155, 146, 142; 330/129, 141

[56] References Cited

U.S. PATENT DOCUMENTS

3,526,855  9/1970  McDonald .
5,617,060  4/1997  Wilson et al. ........................... 330/129

OTHER PUBLICATIONS

"Deltamodulation, A Method Of P.C.M. Transmission Using The 1–Unit Code*", F. de Jager, *Philips Res. Rep.*, vol. 7 (1952).

"A Telemetering System By Code Modulation–Δ–Σ Modulation*", H. Inose et al., *IRE Trans. Space Elect. Telemetry*, vol. SET–8 (1962).

"Delta Modulation Systems", R. Steele et al., *Pentech Press* (1975).

"Oversampled, Linear Predictive And Noise–Shaping Coders Of Order N>1", S.K. Tewksbury et al., *IEEE Trans. Circuits Sys.*, vol. CAS–25 (1978).

"An Analog/Digital Interface For Cellular Telephony", N. van Bavel et al., *IEEE Custom Integrated Circuits Conference* (1994).

"A Bandpass Subsampled Delta–Sigma Modulator For Narrowband Cellular Mobile Communications", F. Gourgue et al., *IEEE International Symposium Circuits And Systems* (1994).

"Multistage Bandpass Delta Sigma Modulators", D.B. Ribner, *IEEE Trans. on Circuits and Systems*, vol. 41, No. 6 (1994).

"Sigma Delta If A–D Converters For Digital Radios", A.M. Thurston, *GEC Journal of Research Incorporating Marcroni Review and Plessey Research Review*, vol. 12, No. 2 (1995).

*Primary Examiner*—Brian Young
*Attorney, Agent, or Firm*—Blakely, Sokoloff, Taylor & Zafman LLP

[57] ABSTRACT

A simple down converting A/D converter utilizing predictive coding principles. By placing the sampler inside the predictive loop, the predictive loop filter can be implemented using DSP techniques, thus eliminating the complexities introduced by use of discrete-time analog circuitry. Then, by re-mapping the output of the predictive loop filter into the analog domain using a D/A converter, the predictive filter output signal is subtracted from the input analog signal to generate the prediction error signal. Therefore, through directly sampling the prediction error signal and converting the output of the predictive loop filter into analog representation using a low-cost multiple bit D/A, the use of discrete-time analog circuitry is eliminated and the complexity of the converter design is greatly reduced. Various features of the invention are disclosed.

29 Claims, 8 Drawing Sheets

METHOD OF SAMPLING, DOWNCONVERTING, AND DIGITIZING A BANDPASS SIGNAL USING A DIGITAL PREDICTIVE CODER

BACKGROUND OF THE INVENTION

1. Field of the Invention

The present invention relates to the field of designing radio receivers using digital signal processing techniques.

2. Prior Art

The following references are relevant to the present invention:

[1] F. de Jager, "Delta modulation—a method of PCM transmission using the one unit code," *Philips Res. Repts.*, vol. 7, pp. 442–466; 1952.

[2] H. S. McDonald, "Pulse code modulation and differential pulse code modulation encoders," 1970 U.S. Pat. No. 3,526,855 (filed 1968).

[3] R. Steele, *Delta Modulation Systems*, New York; Wiley, 1975.

[4] H. Inose, Y. Yasude, and J. Murakami, "A telemetering system code modulation—Δ—Σ modulation, " *IRE Trans. Space Elect. Telemetry*, vol. SET-8, pp. 204–209, September 1962.

[5] S. K. Tewksbury, and R. W. Hallock, "Oversampled, Linear Predictive and Noise-Shaping coders of order N>1, " *IEEE Trans. Circuits Sys.*, vol. CAS-25, pp. 436–447, July 1978.

[6] D. B Ribner, "Multistage bandpass delta sigma modulators," IEEE Trans. Circuits Sys., vol. 41, no. 6, pp. 402–405, June 1994.

[7] A. M. Thurston, "Sigma delta IF A-D converters for digital radios," *GEC Journal of Research Incorporating Marconi Review and Plessey Research Review*, vol. 12, no. 2, pp. 76–85, 1995.

[8] N. van Bavel et al., "An analog/digital interface for cellular telephony," *IEEE Custom Integrated Circuits Conference*, pp. 16.5.1–16.5.4, 1994.

There are many advantages in using digital signal processing (DSP) techniques in the implementation of radio frequency (RF) receivers. Harnessing these advantages, however, relies to a great degree on the ability to effectively convert the signal from the analog to the digital domain.

In conventional RF receiver implementations, the received signal is down converted to in-phase (I) and quadrature (Q) baseband components via one or more conversions to an intermediate frequency (IF), using analog circuitry, and then converted to the digital domain using a pair of pulse coded modulator (PCM) type analog to digital A/D converters operating at baseband. A number of sources of degradation exist in using this design approach that limit the achievable performance. Any phase error in the local oscillators used to mix the signal to I and Q baseband components will impair the receiver's ability to discriminate between signal components above and below the IF center frequency. For example, achieving 40 dB of (I-Q) discrimination requires these local oscillators to be orthogonal to within 0.5°, including all drift from aging, temperature and manufacturing tolerances. This phase accuracy must then be maintained throughout the pair of analog paths up to and including the A/D conversion function. Similarly, the amplitude response of the two analog paths, including any gain mismatch between the two A/D converters, must be well matched to preserve the (I-Q) discrimination of the receiver. Again, to obtain discrimination of 40 dB, it is necessary to match the amplitude response of the two paths to better than 0.1 dB. Such tolerances are possible and may be exceeded by using a calibration routine; however, obtaining this tolerance in a pair of digital paths is routine and therefore provides motivation of digitizing an IF signal directly and thereby avoiding these balancing issues altogether.

Design approaches for direct A/D conversion of the received IF signal using conventional PCM type multiple bit A/D converters eliminate the need for the IF/Baseband analog circuitry. Although the location of a substantial number of high-speed digital switches alongside sensitive RF circuitry invites interference, the potential benefits are often considered to outweigh the new design difficulties. Another problem introduced by the digital processing of IF signals is the need to perform high-speed A/D conversion, a problem compounded by the need for higher linearity in early stages of the receiver. Conventional multiple bit A/D converters have the property that the signal bandwidth available is equal to one half of the sampling frequency, less a margin to allow for anti-alias filtering. The product of the bandwidth and resolution of a converter (or dynamic range) is a measure of its performance, and this will typically be reflected in the difficulty of designing the device and also in its market price. Because a typical IF signal is narrowband compared to its carrier frequency, the use of wideband multiple bit converters does not represent an optimal coding solution to a very specific problem. Some reduction in the A/D converter's processing overhead can be achieved by operating it in a subsampled mode such that the carrier frequency is above the sampling frequency. However, achieving the bandwidth and dynamic range design goals with this method requires enhanced channel filtering prior to the conversion to prevent other channels from aliasing into the passband resulting in an increase in cost and power consumption.

A/D converters designed based on the principles of predictive and interpolative coding (such as delta converters and sigma delta converters), although traditionally operating on baseband signals—especially audio—exhibit attractive properties (see the foregoing references). First, they are an over-sampled coding technique that achieves coding accuracy by fine temporal quantization rather than fine level quantization. Thus, for a given sampling frequency, the usable bandwidth is very much reduced compared with standard pulse code modulation (PCM) techniques, and this trade-off in requirements is reflected by a simplified design suited to low tolerance components. In general, the analog filtering required with such a converter is thus comparatively simple.

A second advantage of these types of coding is their inherent linearity. A multiple bit converter is very susceptible to component tolerances, and a non-linear mapping between the analog and digital domains is difficult to avoid. One very successful means of combating this effect is by the use of high-level additive dither, which effectively decorrelates the non-linearities from the input signal and reduces the effect to a benign noise source. This technique may be used to remove the non-linear effects from the coder, but the limiting performance is ultimately that of a PCM code, and this itself can introduce highly correlated distortion, which in an application comprising evenly spaced radio channels is likely to present difficulties.

The use of interpolative type encoders (i.e., sigma delta converters) in the analog to digital conversion of a high frequency IF have been advocated by many authors, such as the authors of the last two references hereinbefore set forth. Although the advantages of these techniques are clearly delineated by these authors, there remain numerous implementation challenges which must be overcome by a designer who is focused on achieving the low cost and low power consumption goals. The most relevant of these challenges is the fact that although these techniques ultimately produce an oversampled single bit (1-bit) digital representation of the IF signal, the signal must first be converted from its analog continuous-time representation to an analog discrete-time-representation, where it is processed by elaborate discrete-time analog circuitry prior to being mapped into the digital domain (i.e., quantized or digitized). Furthermore, achieving the high dynamic range and the low quantization noise advantages offered by these techniques often requires the implementation of high order encoding loops, with considerable increase in complexity.

BRIEF SUMMARY OF THE INVENTION

This invention utilizes predictive coding principles to implement a simple down converting A/D converter. By placing the sampler inside the predictive loop, the predictive loop filter can be implemented using DSP techniques, thus eliminating the complexities introduced by use of discrete time analog circuitry. Then, by re-mapping the output of the predictive loop filter into the analog domain using a D/A converter, the predictive filter output signal is subtracted from the input analog signal to generate the prediction error signal. Therefore, through directly sampling the prediction error signal and converting the output of the predictive loop filter into analog representation using a low-cost multiple bit D/A, this invention eliminates the use of discrete-time analog circuitry and greatly reduces the complexity of the converter design.

In using mostly DSP techniques in the implementation of the predictive loop, it became possible to make use of the flexibilities offered by these techniques to adapt the characteristics of the digital predictive loop to match those of the input signal. This allows attaining higher dynamic range and lower quantization noise performance with lower order and less complex predictive loops.

The dynamic range performance of the digital predictive encoder of this invention is further extended by utilizing the digital output of the loop to generate the signal for controlling a variable gain amplifier placed at the front of the predictive loop input.

Furthermore, the DC offset performance of the converter is greatly enhanced through incorporation of an offset nulling digital signal processing element which is used to provide an estimate of the offsets introduced by the various circuits. This offset estimate is then introduced at the input of the sampler by combining it digitally with the output of the predictive filter.

This invention is distinguished from prior art described in the references listed in the Prior Art section in four major aspects. First, the placement of the sampler inside the predictive loop allows the predictive filter to be implemented using DSP techniques, thus reducing the complexity of the overall converter plus adding flexibility in re-programming the predictive filter characteristics, which results in improvement in the converter dynamic range and noise performance. Second, operating the predictive encoder in a subharmonic mode allows the predictive loop to down-convert the signal and realize a further reduction in the complexity of the digital logic used in implementing the predicting digital filter. Third, using the digital predictive loop output to control the gain level applied to the input signal allows further increase of the dynamic range of the converter. Fourth, incorporating a built-in offset nuller which eliminates biases introduced by the implementation circuits' imperfections dramatically enhances the DC offset performance of the analog to digital conversion process.

DETAILED DESCRIPTION OF THE INVENTION

In most receiver designs, the received modulated signal is downconverted to an intermediate frequency (IF) and filtered to select the desired signal and reject the undesired adjacent signals and channel induced noise and interference. In modern receivers, the downconverted IF must be further downconverted to baseband and digitized, and then processed by a digital demodulator. The need to process the signal at baseband frequency is driven by the multiplicity of technical challenges caused by directly sampling the IF signal and the high processing throughput required to handle the resultant sampled IF.

Recent advances in bandpass sampling have emerged. They introduce concepts of directly sampling the IF signal. These techniques use mostly analog circuits to achieve the conversion of the IF signal into the digital domain and as such tend to encounter several design implementation difficulties which, when avoided, results in a rather expensive implementation.

This invention introduces a novel design implementation for an analog to digital converter which is capable of sampling and downconverting to baseband a modulated (IF) carrier. The Downconverting Digitizer covered by this invention achieves the following three processes:

1. Conversion of the modulated IF signal to the digital representation (i.e. digitization).
2. Downconversion of the modulated IF signal to a digital representation of the baseband in-phase (I) and quadrature (Q) components.
3. Automatic control of the processed modulated IF signal amplitude to extend the dynamic range of the digitization process and minimize quantization noise.

Figure 1:
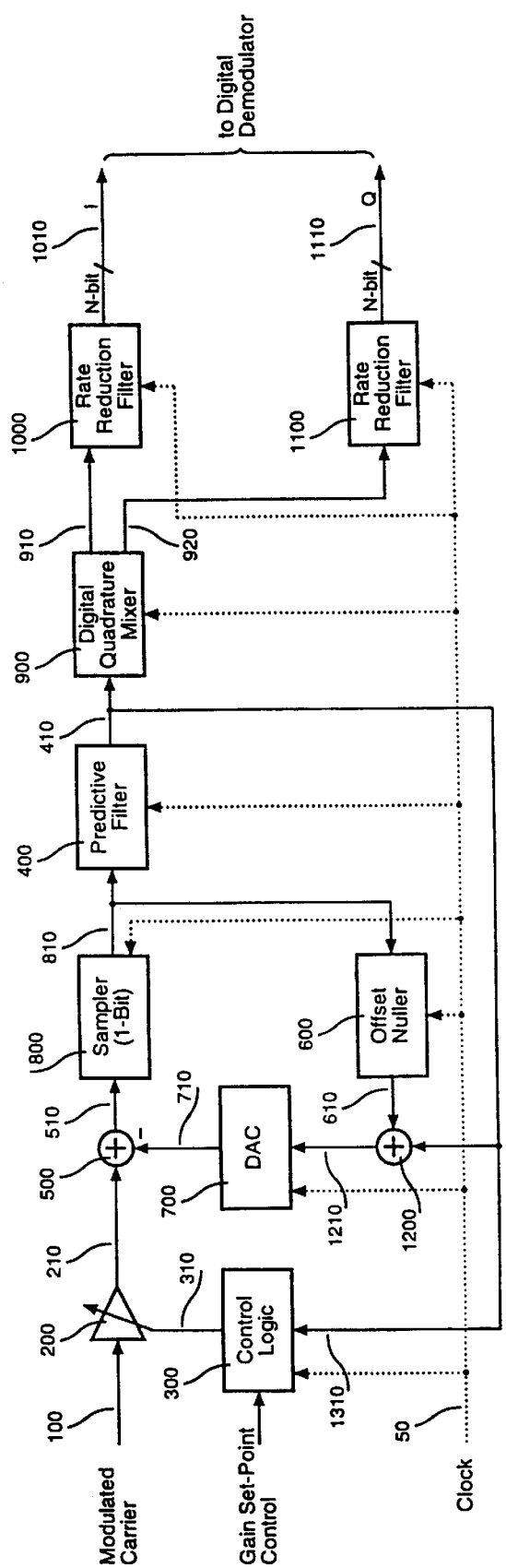
FIG. 1 is a block diagram of the Downconverting Digitizer of the present invention.

FIG. 1 is a block diagram of the Downconverting Digitizer of this invention which is comprised of the following elements:

1. a digitally-controlled variable gain amplifier (200) which adjusts the amplitude of the modulated IF input signal (100) in accordance with the control signal (310) generated by the gain control logic (300).
2. a gain control logic element (300) which converts the predictive filter output signal (410) into a control signal (310) that is used to set the gain value of the variable gain amplifier (200).
3. an analog summing element (500) which generates the error signal (510) by combining the amplifier output signal (210) with the output of the digital summing element (1200) after being converted to analog representation by the digital-to-analog converter (DAC) (700).
4. a sampling element (800) which converts the analog error signal (510) into a digital representation (810).
5. a predictive digital filter (400) which utilizes an aliased component of the sampled error signal (810) to construct a digitally represented prediction of the modulated IF input signal (100).
6. an offset nuller element (600) which computes offset values due to implementation and provides a correction signal to the digital summing element (1200).
7. a digital summing element (1200) which sums the inverse of the offset correction signal (610) to the predictive filter output (410) to provide the DAC input signal (1210).
8. a digital to analog converter (DAC) element (700) which converts the digital output (1210) of the digital summing element (1200) to the analog representation (710).
9. a digital quadrature mixer (900) which mixes the output of the predictive filter (410) to baseband in-phase (I) (910) and quadrature (Q) (920) digital components.
10. two rate reduction filters (1000, 1100) for in-phase (I) (910) and quadrature (Q) (920) baseband outputs which are used to: (a) filter out the undesired alias components; and (b) reduce the sampling rate to be commensurate with the modulated signal bandwidth.

The overall Downconverting Digitizer has an analog section, a digital section, and a mixed-signal section. In this invention, the analog section is minimized to allow maximum use of the flexibility offered by digital signal processing techniques. The analog section of the Downconverting Digitizer of FIG. 1 is comprised the variable gain amplifier (200) and the analog summing node (500). The feedback DAC (700) and the sampler (800) are the mixed-signal elements whose function is to transform the signal from the digital to the analog domain in the feedback path, and from the analog to the digital domain in the feedforward path, respectively. All of the remaining elements of the Downconverting Digitizer are implemented using digital hardware and operate at the rate of the sampling clock (50).

The operation of the Downconverting Digitizer of this invention can be best described in terms of the operation of three loops, each comprised of a group of the aforementioned elements. First, the predictive loop, comprised of the summer (500), the sampler (800), the predictive filter (400), the digital summing element (1200), and the feedback DAC (700). Second, the offset nulling loop comprised of the offset nuller element (600), the digital summing element (1200), the DAC (700), the analog summing element (500), and the sampler (800). Finally, the automatic gain control (AGC) loop, comprised of the AGC control logic (300), the variable gain amplifier (200), the analog summing element (500), the sampler (800), and the predictive filter (400).

The Downconverting Digitizer output signals (1010 and 1110) are multiple-bit digital representations of the baseband in-phase (I) and quadrature (Q) components, respectively, of the modulation. These output signals are normally routed to a digital demodulator portion of the receiver for detection and retrieval of the modulated information.

The underlying principle of the Downconverting Digitizer of this invention is that of the characteristic of the predictive loop. The aforementioned loop generates a prediction (710) of the input signal (100). When the prediction (710) is subtracted at the summer (500), a prediction error signal (510) is generated. In the steady-state mode of operation, this predictive loop minimizes the prediction error signal (510). When this is accomplished, the output of the predictive filter (400) is a digital representation of the analog modulated input signal (100). Minimization of the loop error signal is achieved by placing the maximum frequency response of the predictive filter at the frequency of the modulated carrier after being sampled by the sampler (800). Based on this principle, the sampler (800) plays a critical role in the operation of the Downconverting Digitizer.

Since the operation of the Downconverting Digitizer is based on minimizing the prediction error signal (510) in the steady-state, this error signal is nominally driven to zero. Due to implementation imperfection, certain offsets are generated. These offsets cause the error signal to deviate from its zero nominal value. The offset nulling loop is designed to generate an estimate of these offsets and eliminate them from the error signal.

Successful conversion of the analog input signal (100) to a digital representation is critically dependent on the dynamic range of the Downconverting Digitizer. Since the Downconverting Digiziter operates on the principle of generating a digital prediction of the input signal (100) through the feedback path signal (410), this prediction is best suited to be used to generate a metric which sets the AGC amplifier (200) to the appropriate gain value. The purpose of the AGC loop is to maintain the amplitude of the modulated carrier (100) at a level within the dynamic range of the predictive loop.

Sampler Element (800)

Figure 2:
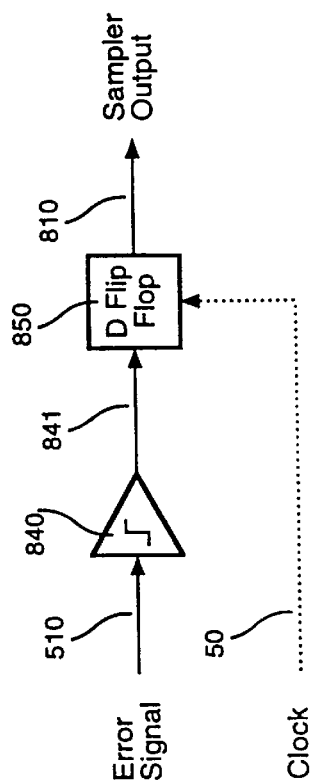
FIG. 2 is a detailed block diagram of the sampler of FIG. 1.

Since the Downconverting Digitizer of this invention operates on the principle of sampling the minimized prediction loop error signal, this error signal can be sufficiently represented by one bit, hence allowing a low-cost implementation of the sampler as a 1-bit analog-to-digital converter (ADC) consisting of a limiter amplifier (840) and a 'D' flip-flop (850) as shown in FIG. 2. In general, any specific application of this invention can be implemented with a multiple bit sampler. However, the description of the Downconverting Digitizer implementation using a 1-bit sampler is used as the basis of the description of the preferred embodiment henceforth, since it results in the lowest cost implementation.

Within the context of this invention, the sampler element converts the loop error signal from an analog to a digital representation. As a consequence of this sampling process, the sampler output signal (810) contains alias components of the loop error signal (510). The predictive structure of this invention utilizes the lowest alias component, denoted $f_a$, of the modulated carrier (100). The relationship between the modulated IF carrier (100) frequency $f_c$, the sampling clock (50) frequency $f_s$, and the alias component $f_a$ are:

$$f_c = [m+n]f_s, \text{ and} \qquad (1$$

alias component $f_a = n\, f_s$ where m is an integer, and n is a fraction such that −½≦n≦½. When n±¼, the implementation complexities of the predictive filter (400) and the digital quadrature mixer (900) are greatly reduced.

The limiter amplifier (840) produces a bi-state continuous time signal (841) which the 'D' flip-flop converts to a digital sample at the clock edge.

In the sampler design shown in FIG. 2, the 1-bit ADC (830) is implemented as a high-gain amplifier (840) designed to limit when the magnitude of the error signal (510) is larger than one-half the magnitude of the least significant bit (LSB) of the feedback DAC (700). The output of the high-gain amplifier (841) is then sampled by a 'D' flip-flop (850) at the clock edge. This flip-flop has input thresholds such that when the amplifier output (841) is above the middle of its voltage range, it is interpreted to be a digital logic "1", and when the amplifier output (841) is below the middle of the voltage range, it is interpreted to be a digital logic "0".

Depending upon the gain-bandwidth characteristics of the semiconductor process used to implement the 1-bit ADC, it may be necessary to precede the limiter amplifier (840) in FIG. 2 with a Track-And-Hold circuit. The Track-And-Hold circuit, when operating at the sampling frequency $f_s$, effectively presents the limiter amplifier with an alias component at the lower frequency $f_a$ which is within the gain-bandwidth range of the semiconductor process used to implement the limiter amplifier (840). The designer of the 1-bit ADC should perform the trade off analysis to determine the need of the Track-And-Hold circuit depending upon the center frequency of the IF, the sampling clock frequency ($f_s$), and gain-bandwidth characteristics of the semiconductor process used to implement the 1-bit ADC.

Predictive Filter Element (400)

The predictive filter (400) plays a central role in the operation of this invention. Having converted the error signal (510) from its continuous-time analog representation to its sampled digital representation using the 1-bit sampler (800), the predictive filter element of the loop is implemented using digital signal processing techniques. The predictive filter element is designed to generate a prediction of the modulated IF (100) at the next sampling epoch. In the context of this invention, this is achieved by placing the poles of the predictive filter (400) to coincide in the frequency domain with the center frequency of the alias component ($f_a$) of the modulated IF (100) after being sampled by the sampler (800). The underlying requirement for generating a valid prediction of the modulated IF (210) at the next sampling epoch is that the bandwidth of the modulation (W) be appreciably smaller than the clock rate ($f_s$) which in turn is related to the carrier frequency according to the following:

$$W << f_c = [m+n] f_s \qquad (2)$$

where m is an integer, and n is a fraction such that −½≦n≦½. As previously stated, when n=±¼ the implementation complexity of the predictive filter (400) and the digital quadrature mixer (900) is greatly reduced. Although the implementation of the Downconverting Digitizer of this invention is valid for any integer value m, selection of m≧2 allows the sampling clock frequency (50) to be selected at a value below the IF center frequency $f_c$. Such a selection greatly simplifies the implementation of the design of the Downconverting Digitizer, and allows it to be used for digitizing higher frequency IF signals than otherwise possible. This provides the benefits of allowing the digital portion of the Downconverting Digitizer to operate at a lower clock frequency $f_s$ (50) while maintaining a high IF center frequency $f_c$. A lower clock frequency $f_s$ (50) results in lower power consumption and lower cost and complexity for the digital hardware of the Downconverting Digitizer. A higher IF $f_c$ reduces the cost and complexity of the radio frequency components preceding the Downconverting Digitizer. This permits the system designer to minimize the overall cost and complexity of the system by selecting the IF center frequency at a value that achieves the lowest cost radio design while simultaneously selecting the sampling frequency at a value that achieves the lowest cost digital hardware design.

Figure 3:
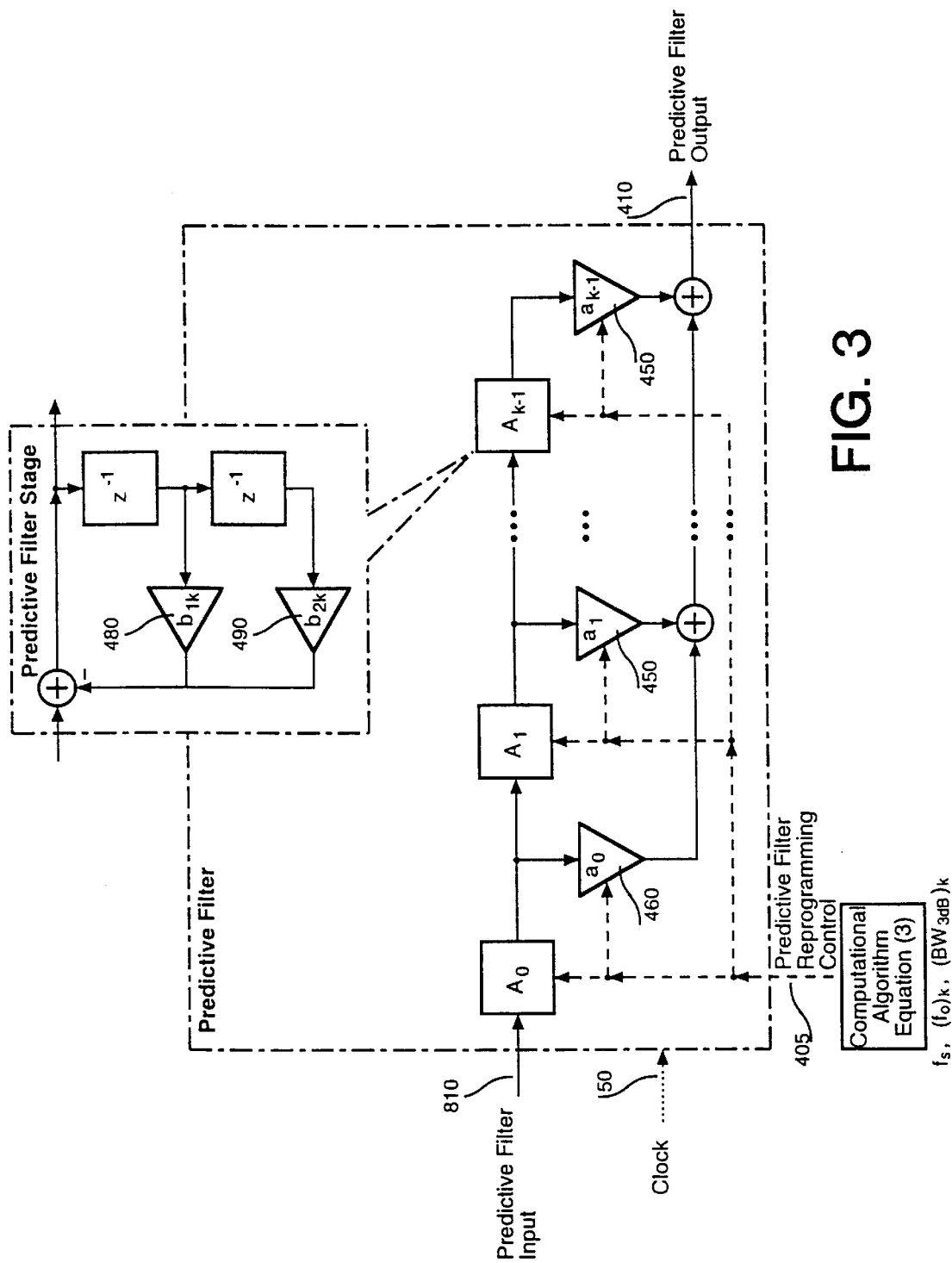
FIG. 3 is presents a generalized structure of the predictive filter of FIG. 1.

A generalized structure of the predictive filter element (400) is shown in FIG. 3. The predictive filter element structure is a cascade of filter stages whose z-plane transfer functions are denoted by $A_k(z)$, k=0 to K-1, where K denotes the order of the predictive filter element. The output of each stage is weighted by a gain factor $a_k$ prior to being summed to generate the output of the predictive filter.

Figure 4:
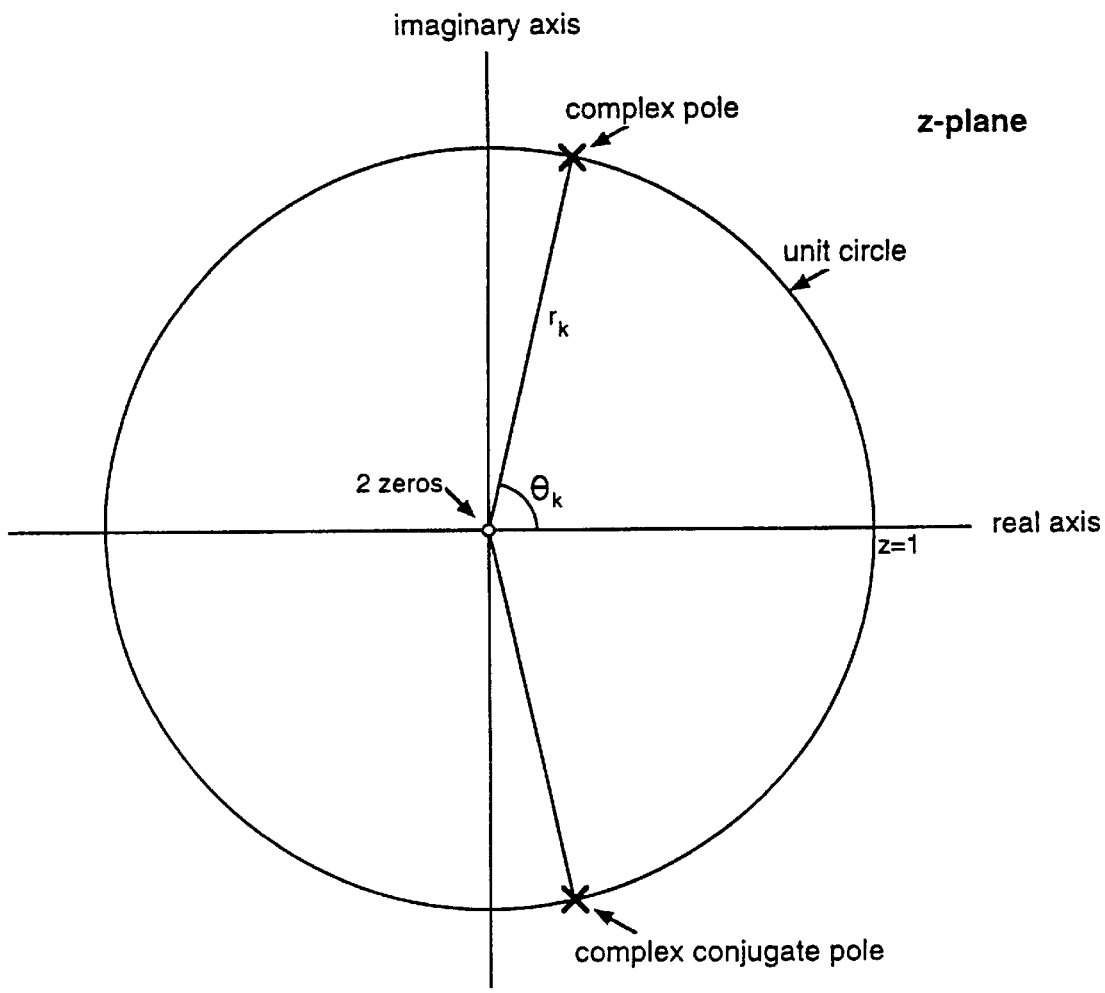
FIG. 4 presents a z-plane representation of a representative filter stage of FIG. 3, each stage of the predictive filter element being implemented as a second-order filter.

As shown in the representative filter stage of FIG. 3, each stage of the predictive filter element is implemented as a second-order filter whose complex pole pair are located in the z-plane as shown in FIG. 4.

Adjusting the filter coefficient $(b_1)_k$ varies the angle between the positive real axis and the radius to the pole. This determines the resonant frequency $(f_0)_k$ of the filter stage. Adjusting the filter coefficient $(b_2)_k$ varies the radial distance of the pole pair relative to the origin of the z-plane. This determines the 3-dB bandwidth $(BW_{3dB})_k$ of the filter stage. These relationships are defined by the following Equations (3).

The Q-value of the k-th filter stage is expressed as:

$$Q_k = \left[\frac{f_o}{BW_{3dB}}\right]_k \qquad k = 0, 1, \ldots, K-1 \qquad 3)$$

$$r_k = \sqrt{\frac{\sin\left(\pi\left[1 - \frac{1}{2Q_k}\right]\right) - 1}{\cos\left(\pi\left[1 - \frac{1}{2Q_k}\right]\right)}}$$

$$\theta_k = 2\pi \frac{(f_0)_k}{f_s}$$

$$(b_1)_k = -2r_k \cos(\theta_k)$$

$$(b_2)_k = r_k$$

The locations of the poles determine the frequency response of the predictive filter (400). The maximum frequency response of the predictive filter stage is placed at or near the center frequency of the sampled, modulated IF ($f_a$). The exact location of the poles is determined by the characteristics of the signal of interest.

Because the predictive filter element (400) is implemented utilizing digital signal processing techniques, poles can be placed to achieve best performance. Such pole placement may not be possible for an analog implementation because component variations due to temperature, process, aging, etc. may result in filter instability. Furthermore, the digital implementation allows the filter response to be reprogrammed by changing the filter coefficients, hence allowing the predictive filter characteristics to be matched to the input signal (100).

One of the main advantages that can be realized by this invention is that the predictive filter (400) is implemented as a digital filter. Unlike analog designs, the filter frequency response is impervious to performance variations due to process, temperature and aging. In addition, the predictive filter response can be reprogrammed to match the modulated IF (100). Within the context of this invention, the following parameters of the generalized predictive structure of FIG. 3 can be reprogrammed:

K=the number of filter stages $a_k$=the weighting gain for each stage $(f_0)_k$=the center frequency of each filter stage $(BW_{3dB})$=the bandwidth of each filter stage By reprogramming these parameters, the frequency response of the predictive loop of this invention can be changed. This can be done upon initialization or dynamically through the use of an external algorithm which derives the values of these settings by implementing the relationship stated in Equations (2).

Conventional, broadband analog-to-digital converters add quantization noise to the digital representation of the signal which extends over the entire Nyquist bandwidth of the sampled signal from 0 Hz to $f_s/2$. The digital predictive loop of this invention, on the other hand, has the inherent advantage of confining the quantization noise to a narrower bandwidth. This noise typically occupies a bandwidth much less than the Nyquist bandwidth. Such reduction in the broadband noise of the digital process following the predictive loop eases the design constraints placed on subsequent digital signal processing elements. This narrowband noise attribute is maintained during dynamic frequency response adjustments mentioned earlier.

The dynamic frequency response adjustment feature of this invention is useful in many applications. As an example, by tracking the instantaneous carrier frequency of the modulated IF (100) using an external algorithm, the computational algorithm outlined in Equation (3) can be used to dynamically adjust the coefficients $(b_1)_k$ and $(b_2)_k$ of the predictive filter such that the center frequency of the predictive filter stages $(f_0)_k$ tracks the carrier frequency as that frequency changes due to Doppler, transmitter/receiver oscillator drift, etc. This allows the Downconverting Digitizer to maintain a high signal-to-quantization noise ratio of the digital representation (410) of the modulated IF (100).

Another application of dynamic frequency response adjustment feature of this invention is that it can be used to reduce the distortion caused by interfering signals in a multi-channel receiver application such as cellular telephony. In the presence of interference, an external algorithm can adjust the predictive filter parameters to allow to better predict the interfering signals, thereby allowing these signals to be removed through subsequent digital filtering without undo distortion to the signal of interest. Such an external algorithm can derive a metric of the adjacent channel interference level by comparing the signal power at the output of consecutive stages of the predictive filter structure (400). When this comparison indicates the presence of a strong adjacent channel interference, the predictive filter coefficients $(b_1)_k$ and $(b_2)_k$ are dynamically adjusted using the computational algorithm of Equation (3) to increase the effective bandwidth $(BW_{3dB})_k$ of the predictive filter stages. Increasing the effective bandwidth of the predictive filter prevents undesired effects which could be caused by the presence of a strong adjacent channel interference, such as slope overload and intermodulation effects. Thus, by allowing the capability for dynamic adjustment of the frequency response of the predictive digital filter, the Downconverting Digitizer of this invention can be designed to dynamically respond to an infrequent increase in the adjacent channel interference while maintaining higher dynamic range when such an interference is within nominal level.

An added benefit of the digital implementation of the predictive filter (400) is the word length expansion. In other words, the input samples to the predictive filter (810) can consist of 1-bit of quantized signal while the output samples of the predictive filter (410) consist of multiple bits. By allowing the sampler to be implemented as a 1-bit sampler, this invention realizes reduction in implementation cost by simplifying the sampling element without sacrificing performance. In addition, this word length expansion feature of the predictive filter (400) increases the precision of the digital representation (410).

Dynamic range of signals in digital signal processing systems is determined by the number of bits in the digital representation. Each additional bit provides approximately 6 dB of additional dynamic range. The predictive filter (400) produces word length expansion, resulting in high dynamic range in the digital representation of the signal (410). The dynamic range of the invention is determined in part by the number of bits used out of the predictive filter for the feedback signal (410) input to the DAC (700). The determination of this number of bits is based on the following factors: (1) the implementation cost of the feedback DAC (700); (2) the dynamic range requirement; and (3) the complexity of the predictive filter (400).

Figure 5:
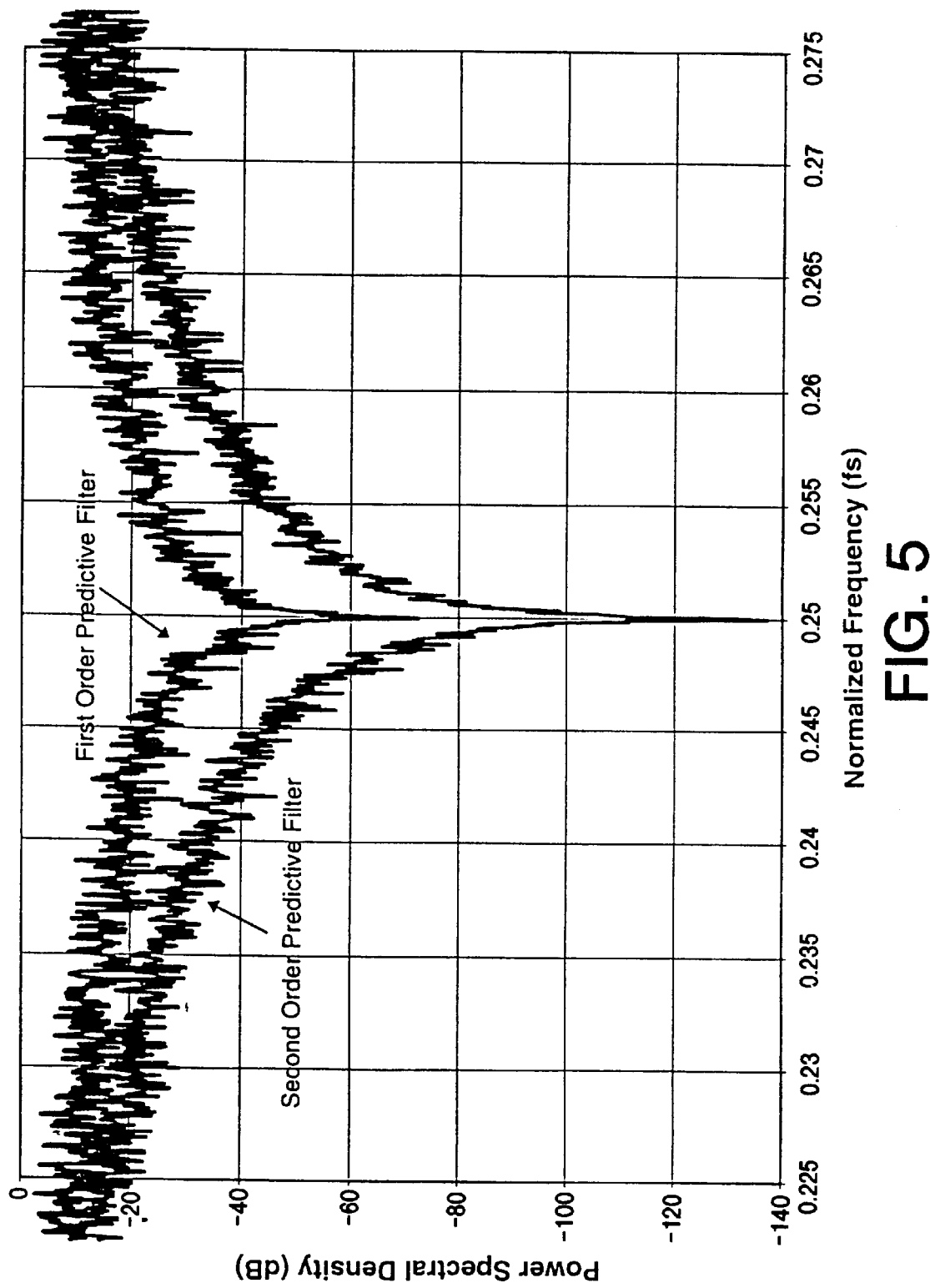
FIG. 5 is a chart illustrating the improvement in the dynamic range and detection bandwidth obtained by increasing the predictive filter order from one to two.

FIG. 5 illustrates the improvement in the dynamic range and detection bandwidth obtained by increasing the predictive filter (400) order from one to two. This improvement is achieved by reshaping the power spectral density of the quantized error signal (810). These plots show the power spectral density of the sampler output when the input to the predictive loop consists of additive white Gaussian noise (AWGN) with root mean square (rms) value equal to an LSB ($\Delta$) of the feedback DAC (700). The power spectral plots show that the quantization noise is at a lower level for a broader range of frequencies in the sampling bandwidth using a second order predictive filter. The higher order predictive filter allows the loop to push more noise out of the bandwidth of interest, thus creating a notch in the quantized error signal spectrum. The second order predictive filter causes a larger notch to develop. The size and shape of the notch determines the degree to which the loop minimizes quantization noise of the sampled signal about the center frequency $f_a$. This is an indication of how well the predictive filter (400) is at estimating the signal at the next sampling epoch.

The predictive filter element (400) performs two functions within the loop. First it creates an estimate of the input signal (100) at the next sampling epoch. Secondly, the predictive filter element (400) filters out the quantization noise while increasing the word length of the digital representation of the signal (410). It is this second function of the predictive loop that lowers the noise bandwidth of the output signal. Conventional analog-to-digital converters inject quantization noise ($\sigma^2_e$) with a power of $$\sigma^2_e = \frac{\Delta^2}{12} \tag{4}$$

Thermal noise present at the input to the conventional ADC gets sampled and output. The Downconverting Digitizer generates its output by passing the sampled signal (810) through the predictive filter (400), which is a narrowband bandpass filter tailored to the signal of interest. Thus noise components outside the band containing the desired signal undergo significant attenuation in the predictive filter. (Additional out of band filtering is provided by the rate reduction filters (1000, 1100).) Since the predictive filter increases the word length of the sampled signal, the magnitude of the LSB of the signal representation is reduced and therefore the quantization noise power is reduced (from equation 4). In addition, with a specific selection of the predictive filter poles, the overall predictive loop can be made to further reduce the thermal input noise and quantization noise outside the vicinity of the modulated signal bandwidth. This noise shaping characteristic requires that the poles of the predictive filter be located at the inside of the z-plane unit circle.

Analog-to-digital converters typically trade dynamic range for detection bandwidth. The dynamic range of the Downconverting Digitizer of this invention is determined by the depth of the notch above the point at which the width of the notch equals the signal bandwidth. Increasing the order of the predictive filter (400) both deepens and widens the notch in the quantized error signal spectrum. The second order predictive filter thus provides significant performance improvement over a first order predictive filter. The deeper notch provided by the second order predictive filter achieves a greater dynamic range. The wider notch allows signals with wider bandwidths to be represented with higher accuracy and more precision.

Since the predictive filter output (410) of this invention has a high dynamic range, the DAC (700) must support the same dynamic range. Fast and wide dynamic range DACs are economical to implement, much more so than a similar size and speed traditional analog-to-digital converter. In effect, this invention utilizes the high dynamic range DACs with low implementation complexity and cost as an element in the implementation of high dynamic range, broad detection bandwidth analog-to-digital converters.

In considering the die size of a hardware implementation, the use of a digital predictive filter (400) and a multi-bit DAC (700) offers several advantages compared with other oversampling implementations. For example, typical implementations of oversampled analog-to-digital converters utilize switched-capacitors to implement filtering and signal summing or subtracting functions. Those approaches require that substantial die area be utilized to implement the switched capacitors. In contrast, the DAC (700) of this invention can be implemented in a fraction of the die area used for the switched-capacitor structures of comparable oversampled converters. Furthermore, the digital implementation of the predictive structures can be implemented using minimum feature size transistors, and consequently the digital logic implementing the predictive filter (400) occupies very little die area.

Further reduction in implementation cost of this invention is obtained by selecting the frequency of the sampled modulated carrier ($f_a$) to be $f_s/4$. The selection of the center frequencies of the predictive filter stages $(f_0)_k$ equal to $f_a=f_s/4$ greatly simplifies the implementation by creating trivial gain values in the predictive filter. This is illustrated in the implementation example presented later.

Digital-to-Analog Converter (DAC) (700)

This element converts the digitally-represented sum (1210) of the predictive filter output (410) and the offset nuller correction signal (610) to an analog representation (710). The number of bits of the DAC (700) is chosen to be sufficient to ensure that the quantization noise introduced by the DAC (700) is below the quantization noise and prediction noise of the predictive filter (400) preceding the DAC.

Digital Summing Element (1200)

The digital summing element (1200) sums the offset nulling correction signal (610) to the predictive filter output (410) providing the DAC input signal (1210).

Analog Summing Element (500)

The analog summing element generates the error signal (510) by adding the analog representation of the prediction signal (710) to the amplified, modulated IF signal (210). The total delay around the predictive loop is maintained at two clock epochs. The effect of this delay, when combined with the selection $f_a=f_s/4$, results in a sign inversion of the feedback signal (710). This allows the negative feedback to be realized by simply adding the signal (710) to the signal (210) at the analog summing node (500).

Automatic Gain Control Logic (300)

Figure 6:
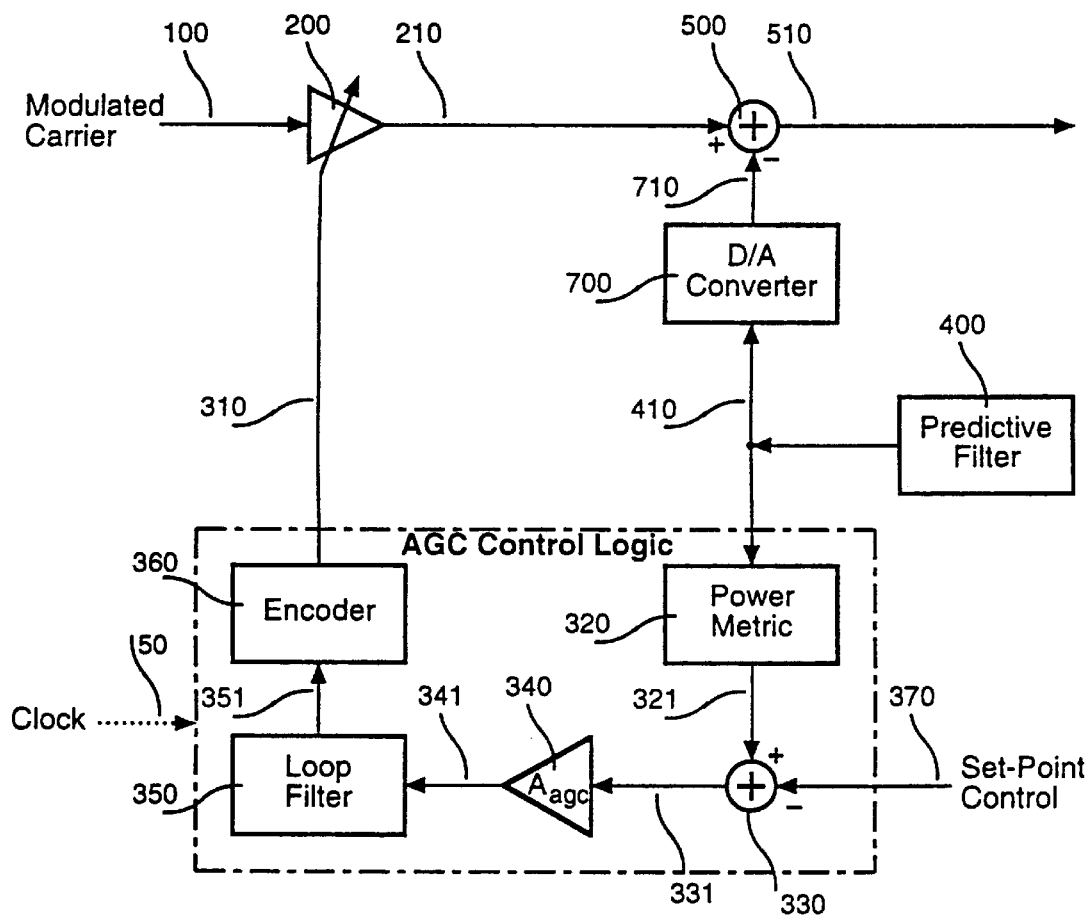
FIG. 6 is a block diagram of the AGC loop.

Receiver dynamic range requirements are typically much larger than what can be achieved by the analog-to-digital converter alone. The dynamic range of the received signal is driven by two contributing factors. First, a rapidly varying component that contains the modulated information. This component of the dynamic range is referred to as the instantaneous dynamic range. Second, there is a slowly varying component due to external effects that carries no useful information regarding the modulated information. The receiver must have sufficient dynamic range to support both of these components. The dynamic range provided by the predictive loop of this invention can be designed to be equal to or greater than the entire dynamic range of the received signal. However, a more cost effective approach can be achieved by utilizing the fact that the received signal dynamic range partially consists of a slowly varying component, which contains no information regarding the modulation. That component can be removed with an automatic gain control (AGC) loop prior to the predictive loop. Since the predictive filter output (410) is a digital prediction of the modulated carrier (100) to the input of the Downconverting Digitizer, this signal is ideal for controlling the AGC. The purpose of the AGC loop is to maintain the magnitude of the modulated IF (100) at a level within the dynamic range of the predictive loop. A block diagram of the AGC loop is shown in FIG. 6. The AGC loop is comprised of the AGC control logic (300), the variable gain amplifier (200), the analog summing element (500), the sampling element (800), and the predictive filter (400). The AGC control logic element (300) consists of the power detector (320), the summing node (330), the AGC loop gain element (340), the AGC loop filter (350), and the gain control encoder (360). The power detector (320) provides an estimate of the power of the predictive filter output (410). The AGC loop operates with any monotonic function of the signal level including power or magnitude.

The output of the power detector (321) is compared to the externally provided AGC level set point control (370) to generate an AGC gain adjustment signal (331). The AGC level set point control (370) adjusts the AGC output level (210). The AGC control logic (300) sets the AGC (200) gain such that the signal level at the amplifier output (210) is commensurate with that of AGC level set point control (370). The inputs to the AGC control logic (300) are the predictive filter output (410) and the AGC level set point control (370). The AGC gain adjustment signal (331) is amplified by the AGC loop gain element (340). The gain applied by the AGC loop gain element (340) determines the loop settling time.

The amplified gain adjustment signal is filtered by the AGC loop filter (350). Since the AGC loop is designed to respond to slow variation in the signal dynamics, the AGC loop filter (350) reduces the rate of the power detector output (320) by averaging the value of this output. The encoder (310) is an element which converts the loop filter output (341) to the proper format to control the variable gain amplifier (200).

Variable Gain Amplifier (200)

The variable gain amplifier(200) applies gain to the received signal (100) as a function of the AGC control logic output (310). The variable gain amplifier (200) has sufficient controllable gain to entirely remove the slowly varying component of dynamic range of the received signal (100).

Offset Nuller (600)

All analog-to-digital converters suffer some performance degradation due to internally and externally generated offsets that result in deviation of the digitized output from the ideal. These offsets can result from component variations due to process, temperature and aging as well as aliasing of sample clock harmonics added to the input signal via undesired analog coupling. These offsets tend to be difficult to detect and remove.

An advantage of the Downconverting Digitizer of this invention is the integrated offset nuller element (600) that automatically and dynamically detects and removes offsets that would otherwise impair the analog-to-digital conversion. Conventional implementations of analog-to-digital converters cannot dynamically remove the effects of offset error. Typical analog-to-digital converters require a manual calibration or a calibration mode that requires the converter to be off-line during calibration. These types of calibration are non-dynamic, and as such, are susceptible to temperature and aging effects and may ultimately result in some performance degradation due to offset.

The offset nuller element (600) of the Downconverting Digitizer dynamically determines offset during operation, thereby requiring no manual calibration of off-line mode. During the analog-to-digital conversion process, the offset nuller continuously estimates the size of the offset and removes it.

Figure 8:
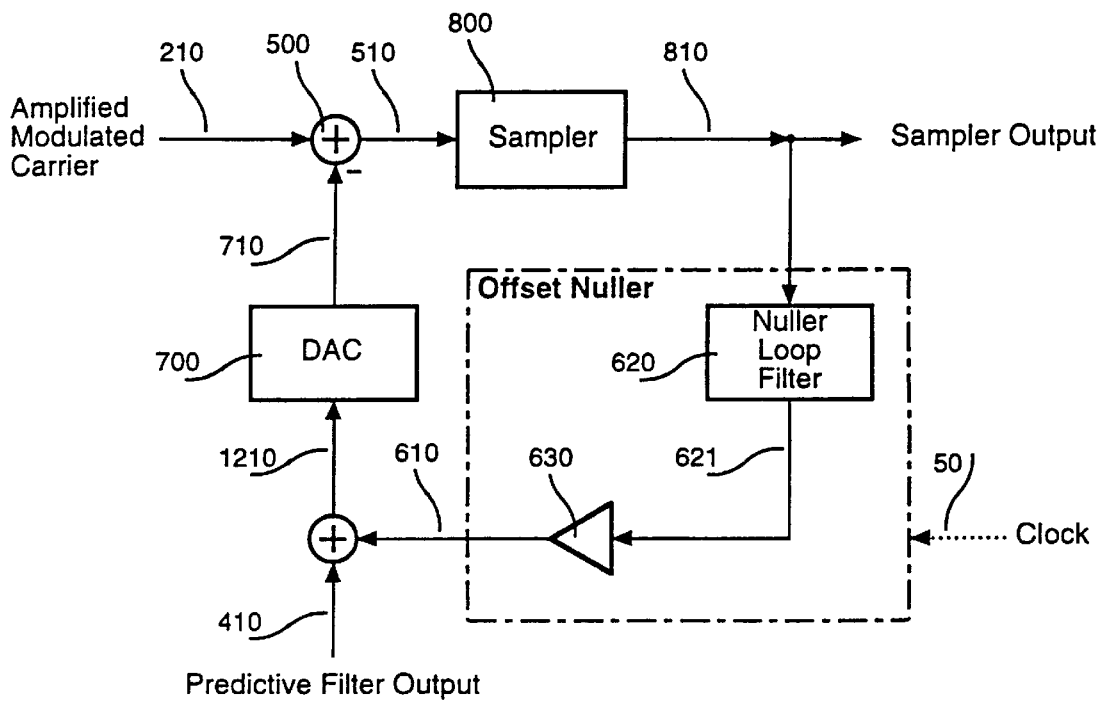
FIG. 8 is a block diagram of the offset nuller loop.

A block diagram of the offset nuller loop is shown in FIG. 8. The offset nuller loop consists of the offset nuller element (600), the digital summing element (1200), the DAC (700), the analog summing element (500), and the sampler (800).

Because the predictive loop operation drives the loop error signal (510) to zero, in the absence of an offset, the average of the values output from the sampler (800) should be zero. If an offset is present, the average value of the sampler output is proportional to that offset. The offset nuller (600) averages the sampler output to determine the offset correction signal (610). The nuller loop filter (620) computes the average of the sampler output (800). The estimated offset value is then amplified by the digital gain (630) and then combined with the predictive filter output to generate the feedback signal (1210).

Digital Quadrature Mixer (DQM) (900)

Figure 7:
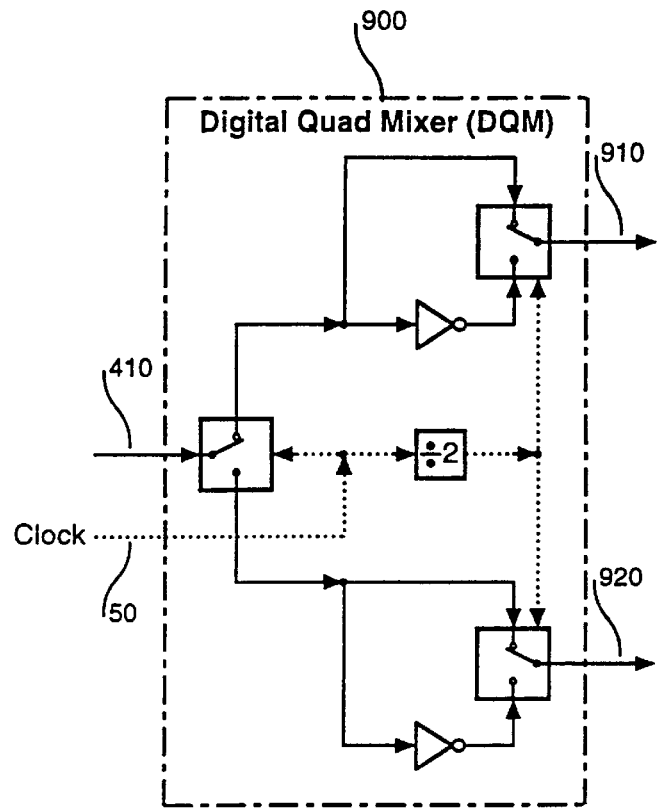
FIG. 7 illustrates the preferred implementation of the digital quadrature mixer of FIG. 1.

The function of the DQM (900) is to downconvert the output of the predictive filter (400), which has a center frequency $f_a$, to baseband in-phase (I) and quadrature (Q) components. Conventionally, this downconversion to baseband requires multiplying the signal centered around the frequency $f_a$ by $\sin(f_a)$ and $\cos(f_a)$ to generate the (I) and (Q) components, respectively. Since, in this invention, $f_a$ is selected to be equal to $f_s/4$, the values of $\sin(f_a)$ and $\cos(f_a)$ computed at the epoch of the clock $f_s$ are simply $\{0, 1, 0, -1\}$ over one cycle of $f_a$. Hence, the selection of $f_a=f_s/4$ offered by this invention allows a significant reduction in the implementation of the DQM element (900). As shown in FIG. 7, the implementation of the DQM is a simple circuit which routes alternate output samples of the predictive filter to either the in-phase (I) (910) or quadrature (Q) (920) outputs. Each of these two outputs I and Q are then alternately inverted to generate the final in-phase (I) and quadrature (Q) output samples.

Rate Reduction Filter (1000, 1100)

The rate reduction filters (1000) and (1100) perform two functions: filtering and sample rate reduction of the inphase (I) and quadrature (Q) components. The rate reduction filters (1000), (1100) are designed to reject the double frequency term ($2* f_a$) generated in the DQM (900). In addition, the rate reduction operations filter the input signal to prevent aliasing due to sample rate reduction. The filtering performed by the rate reduction filters is significantly greater than required to prevent aliasing. These digital filters are designed to pass the signals of interest without attenuation. Undesired signals outside of the band of interest are attenuated. This attenuation provides the Downconverting Digitizer with the feature of producing a sampled signal with lower noise bandwidth than the input signal.

Sample rate reduction is performed to reduce the processing rate of the digitized signal. The implementation of each rate reduction filter (1000 and 1100) is identical. Since they are implemented digitally, the in-phase (I) (1010) and quadrature (Q) (1110) signals of the output of the Downconverting Digitizer do not undergo losses due to gain and phase imbalance that typically accompany analog implementations.

Implementation Example

The Downconverting Digitizer of this invention was implemented and verified as part of a wireless telephone receiver. The semiconductor process for this design was CMOS, 0.6 micron, 2-poly, 3-metal. The overall circuit was incorporated with other functions on a mixed signal CMOS integrated circuit and verified to meet the design specification required for the operation of the wireless telephone receiver. The details of the circuit implementation are shown in FIG. 9.

Figure 9:
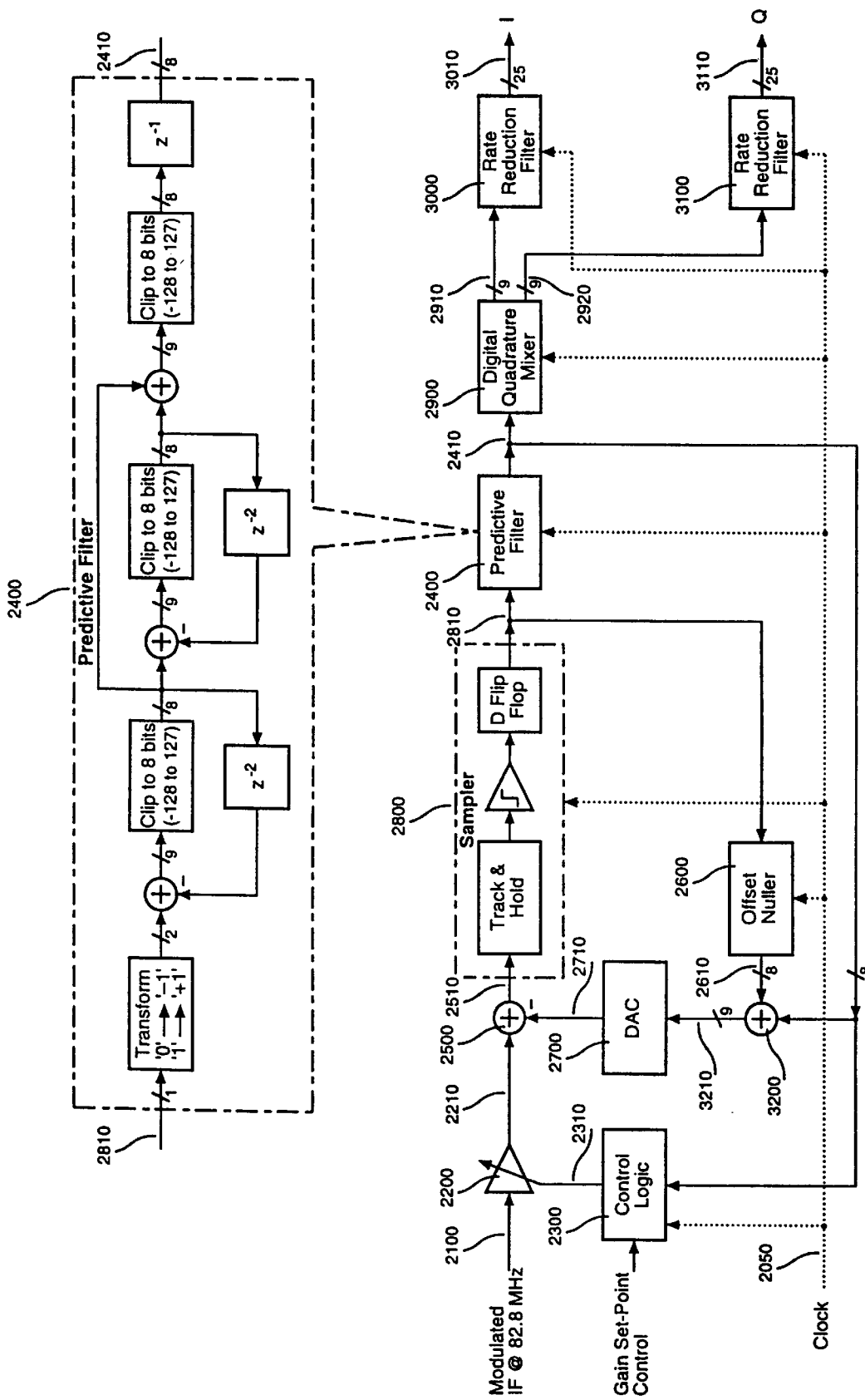
FIG. 9 is a block diagram illustrating a specific implementation of the present invention.

In the implementation example shown in FIG. 9, the modulated IF is centered at $f_c=82.8$ MHz with a two-sided bandwidth of 30 kHz. For this particular design, the sample rate ($f_s$) was chosen to be 14.4 MHz. This results in spectrally inverted $f_a$ at 3.6 MHz. This corresponds to the following parameters in Equation 1.

$$f_c = 82.8 \text{ MHz} = [m+n]f_s = \left[6 - \frac{1}{4}\right] * 14.4 \text{ MHz}$$

$$f_a = -3.6 \text{ MHz} = -\frac{1}{4} * 14.4 \text{ MHz}$$

The negative sign indicates spectral inversion.

In performing the design tradeoff analysis of the gain bandwidth characteristics of the selected semiconductor process and the frequency of the IF and the sampling clock frequency, it was determined that a track-and-hold circuit was required in the sampler. The sampler (2800) is implemented as a track-and-hold element, followed by a limiter and a 'D' flip flop as shown in FIG. 9. The track-and-hold element is used because the CMOS implementation of the limiter does not have sufficient gain-bandwidth at $f_c$=82.8 MHz to allow the limiter to settle to a bi-state level at the next sampling epoch. The track-and-hold creates an alias frequency at $f_a$, which the limiter can drive to a bi-state value for conversion to a digital format by the 'D' flip-flop.

The coefficients of the predictive filter structure (2410) shown in FIG. 9 are:

$a_1 = a_2 = 1$ $(b_1)_1 = (b_1)_2 = 0$ $(b_2)_1 = (b_2)_2 = 1$

In this implementation, delay around the predictive loop from the error signal (2510) to the analog representation of the predictive filter output (2710) is two clock epochs. As a result, the DAC output (2710) is added in the summer element (2500) to the modulated carrier (2100), rather than subtracted from it.

Based on analysis of the required dynamic range of the overall Downconverting Digitizer, the DAC (2700) is designed as a 9-bit DAC. The 9-bit DAC (2700) has a maximum peak-to-peak output voltage of 250 mV. The DAC (700) is designed to have a settling time sufficiently small to ensure that the error signal (2510) settles in time for an accurate conversion by the 1-bit ADC (2800).

The output of the offset nulling element (2610) is added digitally to the output of the predictive filter. The DAC output is then added to the analog amplified, modulated IF (2210). The combined output of the predictive filter and the offset nuller is converted to an analog representation using the 9-bit DAC. The summing element generates the error signal (2510) by adding the analog representations of the nulling signal and the prediction signal (2710) to the amplified, modulated IF (2210).

The AGC control logic (2300) is designed to control a multi-stage amplifier (2200). The total gain realized by the multi-stage implementation of the variable gain amplifier (2200) has a maximum value of 71 dB and a minimum value of −1 dB. Each stage of the multi-stage amplifier is digitally-controlled and has two nominal gain values. The nominal gain value of each stage is selected using one bit of the digital control logic output (2310). The gain stages of this variable gain amplifier are controlled according to the following relationships:

| Gain Stage Type | Digital '1' | Digital '0' |
| --- | --- | --- |
| Course | 7.0 dB | −3.0 dB |
| Medium | 4.0 dB | 0 dB |
| Fine 3 | 0 dB | −2.0 dB |
| Fine 2 | 0 dB | −1.0 dB |
| Fine 1 | 0 dB | −0.5 dB |
| Fine 0 | 0 dB | −0.25 dB |

The DQM is implemented as shown in FIG. 8. The rate reduction filters are implemented as a cascade of three comb filters. The output of the rate reduction is decimated to 160 ksps. After rate reduction, these samples are truncated to 10-bits each.

Figure 10:
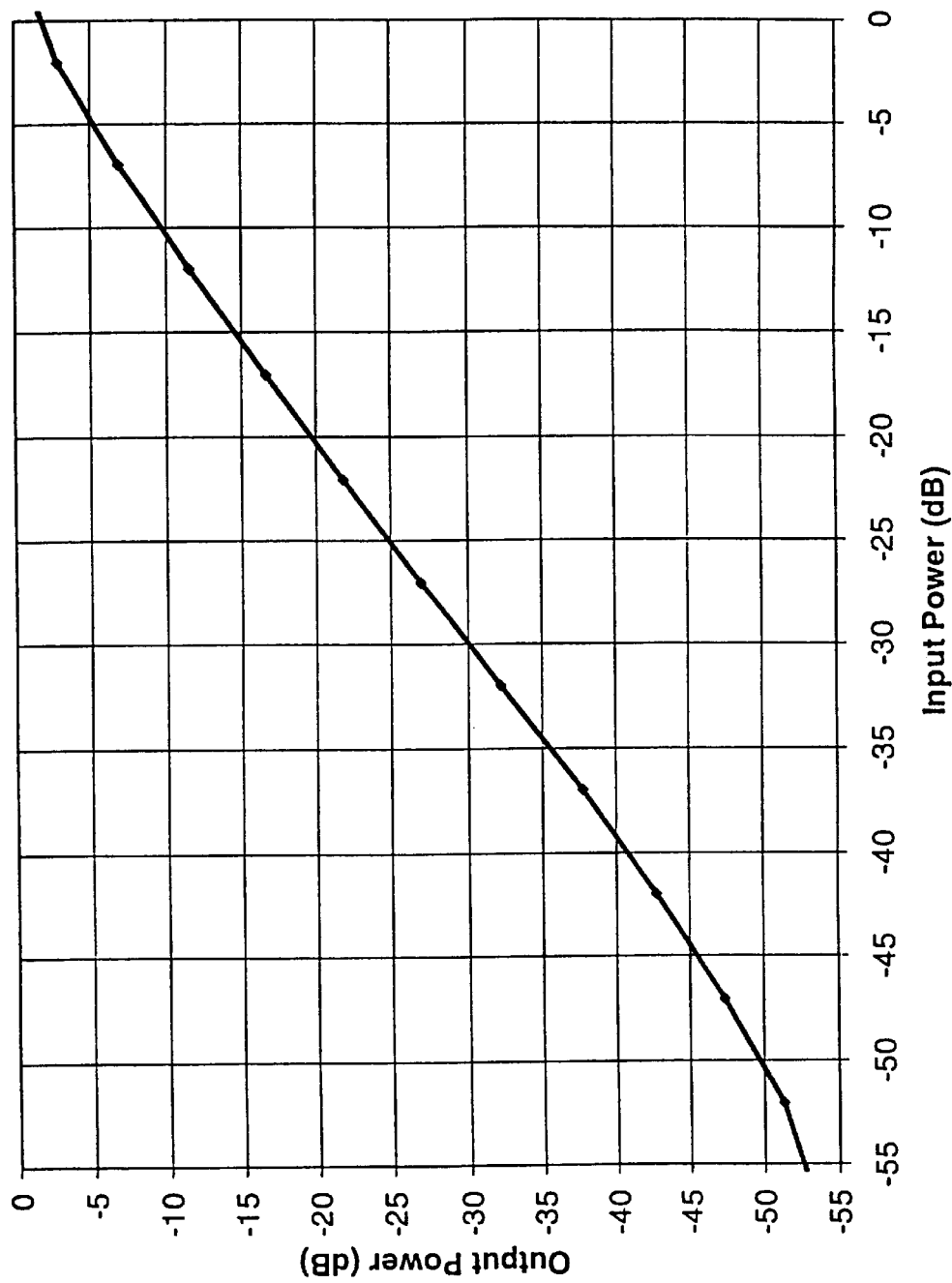
FIG. 10 is a curve presenting measurements of the dynamic range achieved by the integrated circuit of the exemplary implementation example of FIG. 9 without the effect of the AGC loop.

Measurements of the dynamic range achieved by the integrated circuit of this implementation example of FIG. 9 are shown in FIG. 10 without the effect of the AGC loop. As shown in this figure, the implemented Downconverting Digitizer provides more than 52 dB of dynamic range. This is equivalent to the dynamic range performance provided by a dual 8-bit baseband analog-to-digital converter while simultaneously performing the downconversion from IF to baseband with reduced noise performance. The designed AGC loop extends this dynamic range to more than 124 dB.

While preferred embodiments of the present invention have been disclosed and described herein, it will be understood by those skilled in the art that various changes in form and detail may be made therein without departing from the spirit and scope of the invention.

What is claimed is:

1. A downconverting digitizer comprising:
    a variable gain amplifier for coupling to receive a modulated carrier signal, the amplifier having a gain controlled by an automatic gain control loop;
    a subsampling predictive loop coupled to an output of the variable amplifier, the predictive loop predicting the modulated carrier signal;
    a digital quadrature mixer coupled to an output of the subsampling predictive loop; and,
    a rate reduction filter coupled to each output of the digital quadrature mixer.

2. The downconverting digitizer of claim 1 wherein the subsampling predictive loop includes a sampler within the subsampling predictive loop.

3. The downconverting digitizer of claim 2 wherein the subsampling predictive loop comprises a predictive filter coupled to the output of the sampler, the output of the predictive filter being coupled to a digital-to-analog converter, the output of the digital-to-analog converter being subtracted from the output of the variable gain amplifier to provide the input to the sampler.

4. The downconverting digitizer of claim 3 wherein the automatic gain control loop utilizes the output of the predictive filter to provide an automatic gain control signal to the variable gain amplifier.

5. The downconverting digitizer of claim 3 wherein the output of the predictive filter is a digital word of a greater number of bits than the output of the sampler.

6. The downconverting digitizer of claim 5 wherein the sampler is a one bit sampler.

7. The downconverting digitizer of claim 3 further comprised of an offset nuller responsive to the output of the sampler to couple an offset correcting signal to the input of the sampler.

8. The downconverting digitizer of claim 7 wherein the offset nuller provides a digital output responsive to the offset in the output of the sampler and combines the offset nuller output with the output of the predictive filter before coupling to the digital-to-analog converter, the number of bits of the input to the digital-to-analog converter being sufficient to ensure that the quantization noise introduced by the digital-to-analog converter is below the quantization noise and prediction noise of the predictive filter.

9. The downconverting digitizer of claim 3 wherein the total delay around the predictive loop is two sample clock cycles, and wherein the sample rate is 4 times the lowest alias component of the modulated carrier.

10. The downconverting digitizer of claim 9 wherein the digital quadrature mixer multiplies the input thereto at the sample rate by the sequences 0,1,0,−1 and 1,0,−1,0 by alternately directing the signal to each channel and alternately inverting the signal directed to each channel.

11. The downconverting digitizer of claim 10 wherein the rate reduction filters are designed to reject the double frequency term of twice the lowest alias generated in the digital quadrature mixer.

12. The downconverting digitizer of claim 3 wherein the sampler is a one bit sampler.

13. The downconverting digitizer of claim 12 wherein the one bit sampler is comprised of a limiter amplifier and a flip-flop.

14. The downconverting digitizer of claim 12 wherein the sampler operates at a frequency $f_s$ that is less than the center frequency $f_c$ of the modulated carrier.

15. The downconverting digitizer of claim 12 wherein the sampler operates at the center frequency $f_c$ of the modulated carrier.

16. The downconverting digitizer of claim 12 wherein the sampler operates at 4 times the center frequency of the modulated carrier.

17. The downconverting digitizer of claim 3 wherein the sampler operates at a frequency $f_s$ that is less than the center frequency $f_c$ of the modulated carrier.

18. A method of downconverting and digitizing, comprising:

coupling a modulated carrier signal to an analog summing element having a center frequency of $f_c$;

providing a sampler, a predictive filter, and a digital-to-analog converter, the sampler sampling an analog input thereto and providing a digitized output responsive thereto, the predictive filter receiving the digitized output of the sampler, the output of the predictive filter being converted to analog by the digital-to-analog converter and fed back for subtraction by the analog summing element, the predictive filter predicting the modulated carrier signal; and operating the sampler with a sampler clock frequency below the frequency $f_c$.

19. The method of downconverting and digitizing of claim 18 wherein the output of the predictive filter is a multiple bit word having more bits than the output of the sampler.

20. The method of downconverting and digitizing of claim 19 wherein the sampler is a one bit sampler.

21. The method of downconverting and digitizing of claim 18 wherein the predictive filter uses digital processing techniques.

22. The method of claim 21 wherein the predictive filter is programmable to match the carrier frequency of the modulated carrier, the sampling frequency of the sampler and the bandwidth of the modulated carrier.

23. The method of claim 21 wherein the predictive filter is programmable on initialization to match the carrier frequency of the modulated carrier, the sampling frequency of the sampler and the bandwidth of the modulated carrier.

24. The method of claim 21 wherein the predictive filter is programmable to match the modulated carrier provided to the summing element.

25. The method of claim 21 wherein the predictive filter is reprogrammable dynamically to match the varying characteristics of the modulated carrier provided to the summing element.

26. The method of claim 21 wherein the number of filter stages, the weighting gain for each stage, the center frequency of each filter and the bandwidth of each filter stage of the predictive filter are programmable.

27. The method of claim 26 wherein the predictive filter is programmable responsive to changes in the carrier frequency of the modulated carrier due to Doppler effects, transmitter/receiver oscillator drift and changes in the characteristics of the modulated carrier.

28. The method of claim 21 wherein the number of predictive filter stages is programmable.

29. The method of claim 21 wherein the step of coupling a modulated carrier to the analog summing element comprises the step of coupling a desired modulated carrier and at least one adjacent modulated carrier to the analog summing point, and wherein the poles of the predictive filter stages are programmable to coincide with the frequencies of a modulated channel and an adjacent modulated carrier.

* * * * *

UNITED STATES PATENT AND TRADEMARK OFFICE
CERTIFICATE OF CORRECTION

PATENT NO: : 6,002,352
DATED: : December 14, 1999
INVENTOR(S) : Hussein S. El-Ghoroury, et. al.

It is certified that error appears in the above-identified patent and that said Letters Patent is hereby corrected as shown below:

Title page, item [75], inventors: insert –Jian Gu, of San Diego, California--

Signed and Sealed this

Twelfth Day of December, 2000

Attest:

Q. TODD DICKINSON

*Attesting Officer*     *Director of Patents and Trademarks*